United States Patent
Coull et al.

(10) Patent No.: US 9,609,755 B2
(45) Date of Patent: Mar. 28, 2017

(54) NANOSIZED PARTICLES DEPOSITED ON SHAPED SURFACE GEOMETRIES

(71) Applicant: HEWLETT-PACKARD DEVELOPMENT COMPANY, L.P., Houston, TX (US)

(72) Inventors: Richard Coull, Dundalk (IE); Kevin Dooley, Blessington (IE); David Fitzpatrick, Rathfeigh (IE)

(73) Assignee: Hewlett-Packard Development Company, L.P., Houston, TX (US)

( * ) Notice: Subject to any disclaimer, the term of this patent is extended or adjusted under 35 U.S.C. 154(b) by 53 days.

(21) Appl. No.: 13/744,187

(22) Filed: Jan. 17, 2013

(65) Prior Publication Data

US 2014/0199522 A1    Jul. 17, 2014

(51) Int. Cl.
*B32B 3/30* (2006.01)
*B32B 5/16* (2006.01)
*H05K 3/10* (2006.01)
*H05K 3/14* (2006.01)
*H05K 3/12* (2006.01)
*G03F 7/00* (2006.01)
*H05K 1/09* (2006.01)

(52) U.S. Cl.
CPC ......... *H05K 3/1258* (2013.01); *G03F 7/0002* (2013.01); *H05K 1/097* (2013.01); *H05K 2201/09036* (2013.01); *H05K 2201/09045* (2013.01); *Y10T 428/24479* (2015.01); *Y10T 428/24579* (2015.01)

(58) Field of Classification Search
CPC .. B32B 3/30; B32B 5/16; B32B 33/00; B82Y 30/00; B82Y 10/00; B82Y 99/00; H01L 21/782; H01L 27/04; H01L 27/10; H01L 51/0045–51/0048; H01L 2221/1094; H05K 3/1258; H05K 1/097; H05K 2201/09036; H05K 2201/09045; G03F 7/0002
USPC .... 428/168, 195.1, 323, 332, 141, 156, 167; 438/149; 257/E21.414
See application file for complete search history.

(56) References Cited

U.S. PATENT DOCUMENTS

| | | | |
|---|---|---|---|
| 2006/0078724 A1* | 4/2006 | Bhushan et al. | 428/323 |
| 2007/0031639 A1* | 2/2007 | Hsu | B05D 5/08 428/141 |
| 2011/0027947 A1* | 2/2011 | Chabinyc et al. | 438/149 |
| 2011/0223095 A1* | 9/2011 | Harvey | H01B 1/24 423/448 |
| 2011/0303885 A1* | 12/2011 | Vanheusden et al. | 252/513 |

OTHER PUBLICATIONS

Chon et al., Effect of Nanoparticle Sizes and Number Densities on the Evaporation and Dryout Characteristics for Strongly Pinned Nanofluid Droplets, 2007, Langmuir, 23, 2953-2960.*

(Continued)

*Primary Examiner* — Joanna Pleszczynska
(74) *Attorney, Agent, or Firm* — Fabian VanCott

(57) ABSTRACT

Devices with nanosized particles deposited on shaped surface geometries include a substrate with an active material of nanosized particles deposited on a surface of the substrate. The active material has an edge formed at a position determined with a shaped geometry of the surface.

20 Claims, 5 Drawing Sheets

(56) References Cited

OTHER PUBLICATIONS

Cheng, W. et al.; "Nanopatterning Self-assembled Nanoparticle Superlattices by Moulding Microdroplets"; Sep. 28, 2008; pp. 682-690; http://www.nature.com/nnano/journal/v3/n11/full/nnano.2008.279.html.
Jacot-Descombes, L. et al.; "Fabrication of Epoxy Spherical Microstructures by Controlled Drop-on-demand Inkjet Printing"; 2012; vol. 22; Issue 7; http://ioscience.iop.org/0960-1317/22/074012.
Khalil, A. et al.; "Investigation of Electrode Patterns Suitable for Nano-litre Drop Coated Conducting Polymer Composite Sensors"; 2006; http://ulir.ul.ie/handle/10344/1162.
Wang, Y. et al.; "Polymer Coating/encapsulation of Nanoparticles Using a Supercritical Anti-solvent Process"; Aug 20, 2002; pp. 85-99; http://web.njit.edu/~dave/SCF-Coating-Nano-1.pdf.

\* cited by examiner

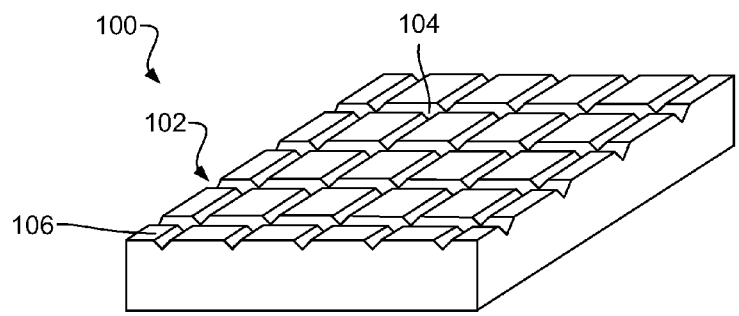
Fig. 1
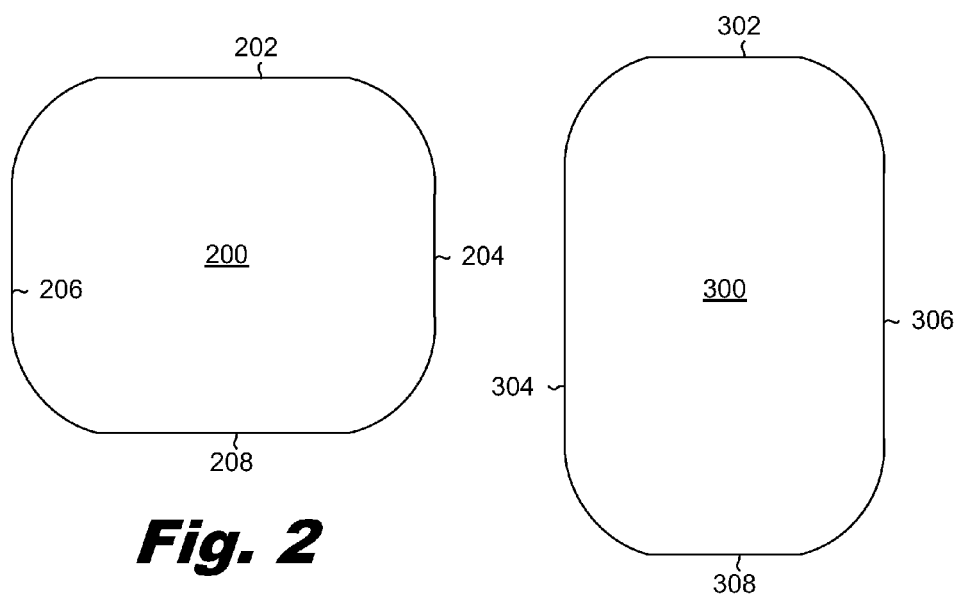
Fig. 2
Fig. 3

800

| Forming a straight edge of an active material on a substrate with releasing a droplet of a liquid carrier containing nanosized particles suspended therein over a surface where the surface has a shaped geometry that controls where the straight edge of the liquid carrier dries. | ~ 802 |

NANOSIZED PARTICLES DEPOSITED ON SHAPED SURFACE GEOMETRIES

BACKGROUND

Nanosized particles behave differently than those particles made of the same material with larger dimensions. For example, some nanosized particles exhibit different colors, melting temperatures, magnetic properties, and/or electrical properties. Nanosized particles generally exhibit these different attributes due to the particles' increased surface area to bulk material ratio. Any particle with one of its dimensions, such as height, width, or length, in the nano-scale is generally classified as a nanosized particle.

BRIEF DESCRIPTION OF THE DRAWINGS

The accompanying drawings illustrate various examples of the principles described herein and are a part of the specification. The illustrated examples are merely examples and do not limit the scope of the claims.

FIG. 1 is a diagram of an example of a substrate with a shaped surface geometry according to principles described herein.

FIG. 2 is a diagram of an example of a dried droplet of an active material according to principles described herein.

FIG. 3 is a diagram of an example of a dried droplet of an active material according to principles described herein.

FIG. 8 is a diagram of an example of a method of depositing nanosized particles on a shaped surface geometry according to principles described herein.

FIG. 9 is a diagram of an example of releasing droplets onto a shaped surface geometry according to principles described herein.

DETAILED DESCRIPTION

Figure 4:
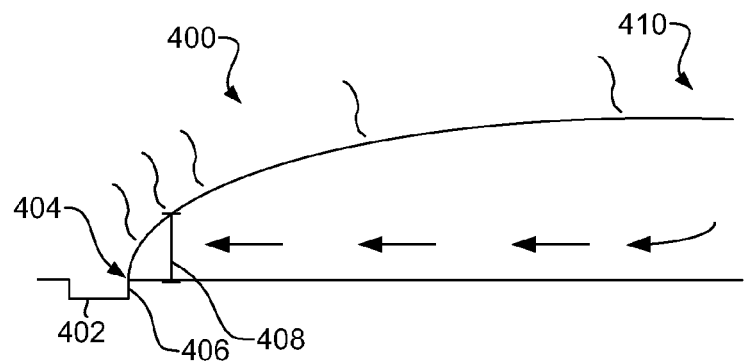
FIG. 4 is a diagram of an example of an edge of a droplet drying at a shallow trench according to principles described herein.

A device can be built using nanosized particles. Such a device can be built by depositing droplets of the nanosized particles dispersed in a carrier liquid onto substrates. When the liquid carrier evaporates off of the substrate's surface, the nanosized particles remain on the substrate and form a material made of nanosized particles.

Precisely controlling how droplets with nanosized particles dry on a substrate within tight tolerances can be difficult, especially when the tolerances are within several micrometers. The principles described herein include a method for depositing nanosized particles on shaped surface geometries. Such shaped surface geometries control where an edge of each droplet forms on the substrate's surface. In at least some instances, the shaped surface geometries also control the nanosized particles' orientation as the droplets dry as well as control a density distribution of the nanosized particles. Such a method includes forming a straight edge of an active material on a substrate by releasing a droplet of a liquid carrier containing dispersed nanosized particles over a surface of a substrate. The surface has a shaped geometry that controls where the edge of the liquid carrier dries. The shaped geometry may cause the edge to have any configuration, such as a straight edge, a curved edge, a wavy edge, jagged edge, another type of edge, or combinations thereof.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

FIG. 1 is a diagram of an example of a substrate (100) with a shaped surface geometry (102) according to principles described herein. In this example, the substrate (100) has multiple trenches (104) formed in rows and columns that extend across the substrate's surface (106). The substrate (100) may be made of silicon, glass, plastic, another material, or combinations thereof. In some examples, the substrate (100) is made of a photoresist material that changes its properties in the presence of certain light wavelengths. Thus, the trenches (104) or any other appropriate surface configuration can be formed using photolithography techniques. Other appropriate materials, other than photoresists, can be used to form the trenches (104). For example, the trenches (104) can be formed through etching, photolithography, micromachining, machining, hot embossing, ultraviolet embossing, soft lithography, ultraviolet nanoimprint lithography, other methods, or combinations thereof. Also plasma treatments may be used to control the surface chemistry of the substrate, and thereby further control the location of the boundary.

The trenches (104) may be spaced apart from one another at any appropriate distance. In some examples, the trenches (104) are spaced apart by twenty five to fifty micrometers. In other examples, the trenches (104) are spaced one micrometer to a hundred micrometers apart from one another. In yet other examples, the trenches (104) are spaced a hundred nanometers to one micrometer apart from one another on the substrate's surface (106).

A droplet of nanosized particles dispersed in a liquid carrier can be deposited onto the substrate's surface (106). As the droplet contacts the substrate's surface (106), the droplet spreads across the surface (106). Initial testing shows that the droplet's edge forms at or near a transition to one of the trenches (104). Thus, the position of where the droplet's edge is formed can be controlled by the position and shape of the trenches' transition. During the initial testing, the droplet's edge formed within two micrometers of the trench. While not being bound to any particular theory, the edge of the droplet is believed to stop at the trench's transition because the droplet's edge was pinned to the trench's transition as the edge advances, and the droplet's surface tension holds back the remainder of the droplet from moving away from the pinned edge of the droplet. As a result, the droplet's edge conforms to the shapes defined by the trenches (104) and thus controls the overall shaped shape formed by the droplet. The size of the nanosized particles used in the testing may have contributed to the offset between the trench and the droplet's pinned edge. The use of other nanosized particles with different sizes or shapes may result in different offsets from the trench or other surface geometries. Initial testing also demonstrated that the shaped surface geometries created better adhesion between the substrate (100) and the resulting deposited active material of nanosized particles when the droplet dried.

In the example of FIG. 1, the transitions to the trenches (104) are straight and will cause a droplet to form an overall square or rectangular shape. However, in other examples, the trenches (104) may be any other appropriate shape. For example, the trenches (104) may cause droplet to form triangular shapes, circular shapes, elliptical shapes, star shapes, half circular shapes, symmetric shapes, asymmetric shapes, other shapes, or combinations thereof.

The nanosized particles may be made of an active material. An active material is a material that responds to the presence of a stimulus. For example, the material may be magnetically responsive, electrically responsive, optically responsive, responsive to other stimuli, or combinations thereof. The nanosized particles can be used as electrical conductors, electrical resistors, capacitors, inductors, optical conductors, used for other functions, or combinations thereof. In some examples, the nanosized particles are made of silver, gold, copper, iron, platinum, zinc, semiconductor materials, carbon fullerenes, graphene, reduced graphene oxide, transition metals from the dichalcogenide family, transition metals from the transition metal oxide family, oxides thereof, nitrides thereof, other materials, or combinations thereof. Further, the nanosized particles dispersed in the liquid carrier may have any appropriate shape, such as spheres, rods, boxes, tubes, cups, clusters, symmetric shapes, asymmetric shapes, platelets, other shapes, or combinations thereof.

By controlling where the edge of the droplet dries, the dimensions of the deposited film of nanosized particles can be controlled. Controlling the dried droplet's dimensions allows for the active material of nanosized particles to be customized for its particular function. For example, the active material may be formed into a nanosized or microsized electrically conductive wire on the surface (106) of the substrate (100). In some examples, the target dimensions to form an electrically conductive pathway range from less than ten nanometers to more than 100 micrometers. Precisely controlling the edges allows the wires to be positioned closer together, provides greater performance predictability, and saves materials. Further, the shaped surface geometry (102) may be used to control where the active material of the droplets flows to and stops on the surface (106) of the substrate (100).

The shaped surface geometry (102) may also be used to control an orientation of the nanosized particles, which will be described in more detail below. Further, shaped surface geometry (102) may also control the density distribution of the nanosized particles within the droplet after the carrier liquid has evaporated away, which will also be described in more detail below.

FIG. 2 is a diagram of an example of a dried droplet (200) of an active material according to principles described herein. In this example, the dried droplet (200) has straight edges (202, 204, 206, 208) that were formed as the droplet dried on a substrate's shape surface geometry (102, FIG. 1). In this example, the droplet has an overall square shape.

The dried droplet (200) is formed of an active material, such as an electrically conductive material. In some examples, multiple droplets may be deposited adjacent to one another to form a line where each droplet overlaps at least slightly with the neighboring droplets. Such a line of electrically conductive material may be used as an electrical conductor, and the electrically conductive line's width is controlled with the shaped surface geometry (102, FIG. 1). An electrically conductive path may be formed by controlling the flow of the nanosized particles to the droplet's perimeter. In this manner, electrically conductive pathways of significantly smaller size can be formed. Such a process may include adjusting the parameters of the surface geometries dimensions, the droplet volume, and the nanosized particle concentration are such that at the point of drying most or all of the particles have migrated to the edge. In other examples, the dried droplet (200) is used to construct other useful devices on the substrate's surface. Additional droplets' can be added one at a time or multiple droplets can be deposited simultaneously to create the structure. The additional droplets may be added to the side of the initially deposited droplet, on top of the initially deposited droplet, deposited in such a manner so that at least one additional droplet overlaps with a prior deposited droplet, deposited in another manner, or combinations thereof. In other examples, combinations of different nanosized particles with different chemistries, shapes, sizes, or other characteristics, are deposited together to create different types of devices. In other examples, the droplets are deposited such that no overlap between the initially deposited droplet and the subsequently added droplets are formed.

The dried droplet (200) may be any appropriate size and volume. In this example, the wet droplet (200) was deposited onto a plasma treated photoresist where the trenches were spaced 1.5 micrometers apart from one another. The photoresist material used was SU8, which is an epoxy based negative photoresist. A first group of trenches extended along the width of the substrate while a second group of trenches were perpendicular to the first group.

FIG. 3 is a diagram of an example of a dried droplet (300) of an active material according to principles described herein. In this example, the dried droplet (300) has an overall rectangular shape with straight edges (302, 304, 306, 308) formed by the shaped surface geometry (102, FIG. 1). When the wet droplet initially makes contact with the substrate's surface (106, FIG. 1), the droplet spreads out in all directions equally. However, the trenches (104, FIG. 1) formed in the substrate's surface are arranged and spaced an appropriate distance away from the initial droplet contact site in such a manner that causes a single wet droplet to dry with an overall rectangular shape. In other examples, multiple droplets are deposited to form a collective rectangular shape. In this example, the dried droplet (300) was also formed on a plasma treated SU8 photoresist material.

FIG. 4 is a diagram of an example of an edge (404) of a droplet (400) drying at a shallow trench (402) according to principles described herein. In the example, the edge (404) of the droplet (400) is stopped at the transition (406) to the shallow trench (402). While not being bound by any particular theory, it is believed that the edge (404) of the droplet (400) experiences the highest rate of evaporation because its smaller cross sectional thickness (408) produces a localized capillary force that acts outward radially. Further, the local curvature of the liquid's free surface at the droplet's edge (404) is greater than the free surface curvature at the center of the droplet. Therefore, an evaporating vapor at the edge (404) has an increased probability of escaping at the edge (404) because there is a lower probability that the escaping vapor will be reabsorbed back into the liquid than the escaping vapor at the droplet's center.

As the edge (404) evaporates at a quicker rate than the liquid near the center (410) of the droplet (400), liquid from the droplet's center (410) replenishes the liquid at the edge (400). As the droplet's fluid flows from the center (410) to the edge (404), the flow brings with it more of the nanosized particles dispersed in the droplet (400) to the droplet's edge (404). At the start of evaporation, the bulk population of the nanosized particles is equally dispersed throughout the liquid droplet. These particles are then fed to the edge by capillary flow where they become trapped due to their relative size compared to the liquid cross sectional area dimension. The finished structure resulting from the dried droplet is dependent on the dimensions of the surface geometry, the droplet volume, and the nanosized particle concentration. Thus, by controlling these factors, locations of where the nanosized particles are deposited when the droplet dries can be controlled as well.

Figure 5:
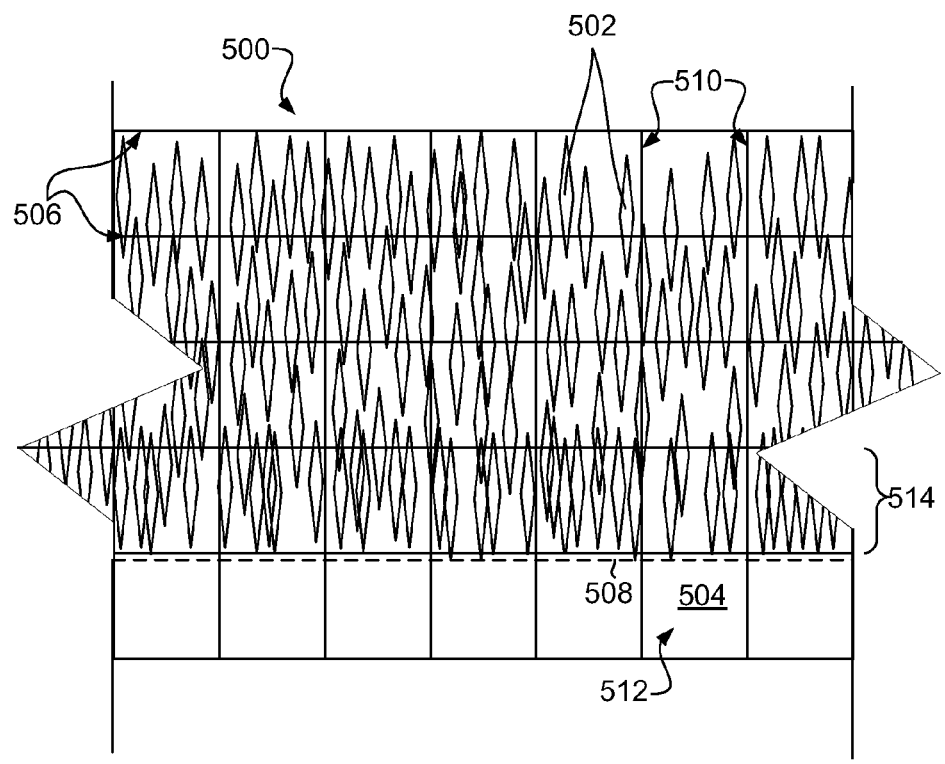
FIG. 5 is a diagram of an example of a nanosized particle orientation in an active material according to principles described herein.

FIG. 5 is a diagram of an example of a nanosized particle orientation in an active material (500) according to principles described herein. In this example, the nanosized particles (502) are deposited onto a surface (504) of the substrate. The substrate's surface (504) has a shaped geometry with a first group (506) of shallow trenches (508) that run perpendicularly to a second group (510) of shallow trenches (508). The first and second groups (506, 510) of shallow trenches (508) collectively form square surface units (512) on the substrate's surface (504).

The droplet initially spreads out over both the shallow trenches (508) and square surface units (512) that are close to the droplet's initial contact site. However, as the droplet spreads out, the forces causing the droplet to spread weaken until they are weaker than the droplet's surface tension. As the droplet's edge approaches the trenches' transitions when the droplet's surface tension is comparatively stronger than the forces causing the droplet to spread, the droplet's edge is pinned to the transition, and the edge held in place by the droplet's surface tension. As a result, the droplet's edge conforms to the shape of the trenches (508).

In the example of FIG. 5, the nanosized particles form the active material (500). The principles controlling where particles in droplets dry is generally referred to as Deegan's mechanism, which describes how the liquid of a droplet tends to flow towards the droplet's periphery as the droplet edges' dry. The principles described herein may be used to mitigate, enhance, or otherwise modify the affects of Deegan's mechanism with respect to how the particles in the droplet are dispersed at the time the droplet is dried.

Initial testing also showed that the orientation of the nanosized particles (502) was similar for all of the nanosized particles (502) located throughout the droplet. Further, initial testing revealed that the affects described in Deegan's mechanism were overcome as the multiple trenches over which the droplet was formed caused the nanosized particles to be substantially more uniform than those substrates without surface geometries. Thus, surface geometries can be used to cause the nanosized particles to be distributed substantially uniformly, as in the example of FIG. 5; to cause the nanosized particles to be deposited at an edge, as in example of FIG. 4; to otherwise cause the nanosized particles to be deposited as desired; or combinations depending on the specific dimensions of the surface geometries.

Figure 6:
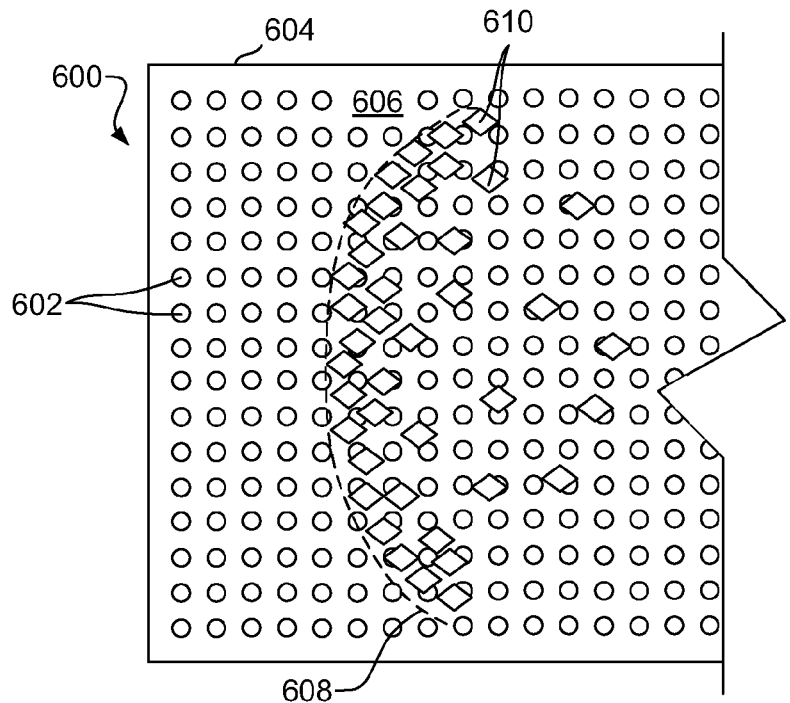
FIG. 6 is a diagram of an example of a shaped surface geometry according to principles described herein.

FIG. 6 is a diagram of an example of a shaped surface geometry (600) according to principles described herein. In this example, the shaped surface geometry (600) has multiple micro-pillars (602) that are formed in the substrate (604) and that extend away from the substrate's surface (606). Such a shaped surface geometry also controls the edge formation of droplets containing nanosized particles dispersed in a liquid carrier that are deposited onto the substrate's surface.

Initial testing shows that such a shaped surface geometry (600) caused the droplet's edge (608) to form at predictable positions on the substrate's surface (606). While not being bound by any particular theory, the droplet's edge (608) may be formed as the droplet edge's forward movement is resisted by the micro-pillars (602). As the droplet spreads out, the micro-pillars (602) pin the droplet's edge (608), and the droplet's surface tension retains the rest of the droplet from moving forward. Initial testing also showed that the nanosized particles (610) in the droplet have a density concentration at the droplet's edge (608) greater than at the center of the droplet.

While the above examples have been described with reference to shaped surface geometries with trenches and micro-pillars, any appropriate shaped surface geometry may be used that causes the droplet's edge to be formed at predictable positions on the substrate's surface. For example, any appropriate protruding feature that protrudes from the surface of the substrate, such as micro-pillars, nodes, bumps, ridges, lips, other features, or combinations thereof may be used in accordance with the principles described herein. Further, any appropriate recess formed in the substrate's surface may also be used, such as trenches, dips, craters, slots, other types of recesses, or combinations thereof.

Figure 7:
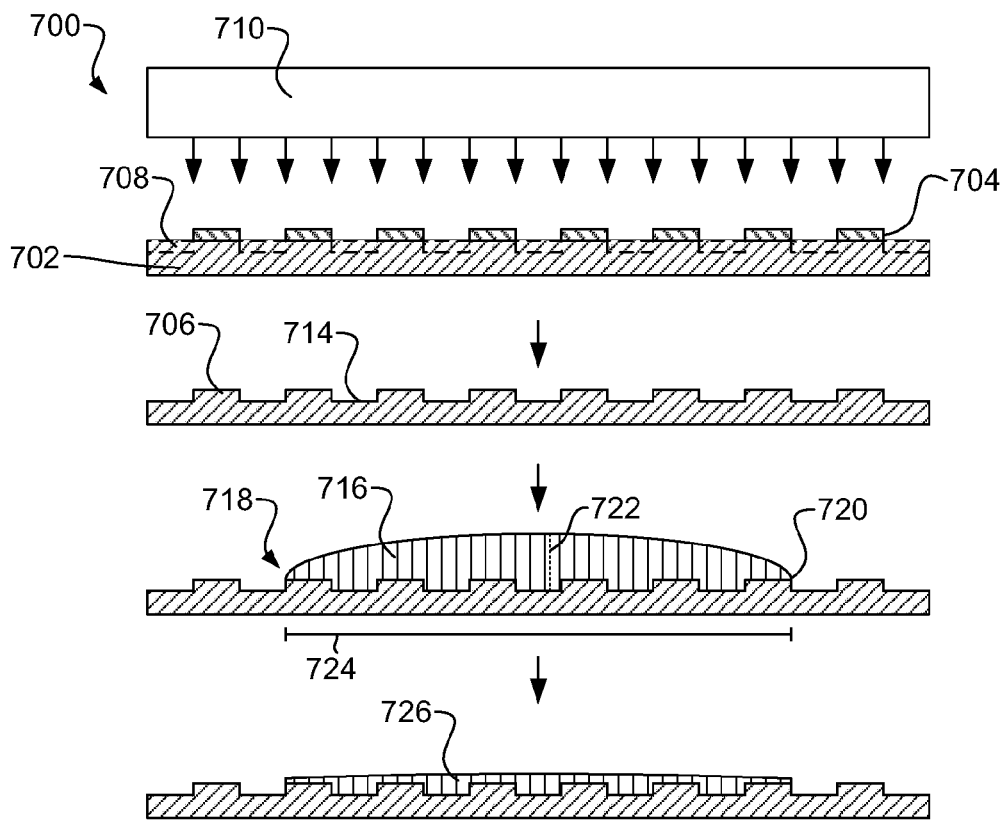
FIG. 7 is a diagram of an example of a manufacturing process according to principles described herein.

FIG. 7 is a diagram of an example of a manufacturing process (700) according to principles described herein. In this example, the substrate (702) is made of a photoresist material that changes its properties when exposed to certain wavelengths of light, like ultraviolet wavelengths. In some examples, the photoresist material is a negative photoresist material, while in other examples; the photoresist material is a positive photoresist material. A non-exhaustive list of photoresist materials that are compatible with the principles described herein include SU8, epoxy based photoresist, polymethyl methacrylate, polymethyl glutarimide, phenol formaldehyde resins, dry films, negative photoresists, positive photoresists, other materials, or combinations thereof.

A mask (704) is placed over the portions of the substrate's surface (706) that are to be protected from the light exposure. When the unmasked portions (708) are exposed to the light from the light source (710), the substrate's chemical structure changes to make it removable by rinsing the substrate with a solution, sand blasting the substrate, using other removal mechanisms, or combinations thereof. The light source (710) may be an ultraviolet light source.

After the mask (704) and the unmasked portions (708) are removed from the substrate's surface (706), the resulting substrate's surface (706) has a series of trenches (714). In other examples, the photolithography process can be used to make micro-pillars or other shaped surface geometries according to the principles described herein. In alternative examples, the photoresist material is used as the substrate. In such examples, the photoresist material is patterned and serves as the active surface.

When the droplet (716) is initially deposited onto the surface (706) of the substrate (702), the droplet (716) spreads out over the trenches (714) and other portions of the substrate (702). As the droplet (716) spreads, the droplet's edges (718) move outward away from the initial contact site with the substrate (702), and the forces causing the droplet (716) to spread weaken. Eventually, the droplet's surface tension becomes stronger than the forces causing the droplet (716) to spread, and the surface tension causes the edges (718) of the droplet (716) to be pinned at the transition (720) to the trenches (714).

As the droplet (716) spreads, the droplet's cross section (722) across the droplet's entire width (724) decreases. Also, when the edges (718) of the droplet (716) stop at the transition (720) of the trenches (714), the droplet's cross section (722) continues to decrease due to evaporation of the carrier fluid. As the carrier fluid evaporates, the density of the nanosized particles in the droplet (716) increase. When all of the carrier fluid has evaporated out, a dried droplet is (726) composed of active material made of the nanosized particles that remains on the substrate's surface (706). The active material may be used as part of a responsive device that responses to a stimulus, such as an optical stimulus, an electrical stimulus, a magnetic stimulus, another type of stimulus, or combinations thereof.

In some examples, the substrate's surface (706) is chemically modified to help control the location of the dried droplet's edge (718). For example, when trenches (714) are used as the shaped geometry and the liquid carrier in the droplet (716) is water based, the substrate's surfaces between the trenches (714) may be caused to be hydrophilic, and a surface of the trenches (714) may be caused to be hydrophobic. Water based liquid carriers in the droplet will easily spread across the hydrophilic surfaces while the hydrophobic surface will restrict the droplet's water based liquid carrier from spreading further. If the substrate is naturally hydrophobic, then the trenches may be left chemically unaltered. On the other hand, if the substrate is naturally hydrophilic, then the areas between the trenches (714) may be left chemically unaltered. In situations where the substrate does not have strong enough hydrophilic or hydrophobic surfaces, both the trenches, and the areas between the trenches may be chemically altered.

Plasma etching and deposition techniques can be used to modify the topography and/or the chemistry of the substrate's surface. Such changes affect the contact angle of the droplet's edge, and thus, affect the droplet formation on the substrate. Consequently, plasma etching and deposition techniques can be used to fine tune the parameters of the structures built with the droplets.

To chemically alter the substrate's material to be either hydrophilic or hydrophobic, the substrate's bulk or surface properties may be chemically altered. To chemically alter the surface of the substrate's material, a coating exhibiting a hydrophobic or hydrophilic characteristic on its outer surface may be bonded to the substrate's surface. To chemically modify the bulk properties of the substrate, hydrophilic or hydrophobic moieties may be added to the substrate's molecules during the substrate's manufacture.

The chemical modifications to the substrate may decrease or increase the droplet edge's contact angle to assist with spreading the droplet or resist the droplet's spread. Thus, the chemical modification can be used in conjunction with the shaped surface geometries to control where the dried droplet's edge is formed.

Other chemical surface modifications other than hydrophilic and hydrophobic modifications may be used to increase the predictability of the formation location of the droplet's edges. For example, techniques may be used to increase or decrease the surface energy of the substrate's surface. In such examples, a plasma treatment is used to improve the ability of the substrate's surface to bond to the nanosized particles in the dried droplet. In other examples, a chemical modification changes the surface roughness of the substrate. Any appropriate chemical surface or bulk modification may be used in accordance with the principles described herein.

Devices made according to the principles described herein may include any appropriate electric device, optical device, magnetic device, or combinations thereof. For example, a non-exhaustive list of devices that can incorporate the principles described herein includes active display matrixes, passive display matrixes, computers, laptops, desktops, electronic tablets, phones, watches, automobiles, airplanes, sensors, global positioning units, satellites, instrumentation, circuit boards, display monitors, appliances, solar cells, other devices, and combinations thereof.

FIG. 8 is a diagram of an example of a method (800) of depositing nanosized particles on a shaped surface geometry according to principles described herein. In this example, the method (800) includes forming (802) a straight edge of an active material on a substrate with releasing a droplet of a liquid carrier containing nanosized particles dispersed therein over a surface where the surface has a shaped surface geometry that controls where the straight edge of the liquid carrier dries.

The shaped geometry may be any appropriate geometric feature that causes the position of the dried droplet's edge to be predictable. The shaped geometry may include shallow trenches, micro-pillars, other protrusions, other recesses, other features, or combinations thereof. Further, the nanosized particles may be any appropriate active material that is responsive to a stimulus, such as electrical stimuli, magnetic stimuli, optical stimuli, other stimuli, or combinations thereof.

The shaped surface geometry may be aided with a surface chemical modification that increases the reliability of predicting where the dried droplet's edge will form. In some examples, the chemical modification changes the hydrophilicity of the substrate's surface to either lower resistance to spreading the droplet or increasing resistance to spreading the droplet.

Further, the shaped surface geometry may also be used to control the nanosized particle density distribution within the dried droplet and/or the orientation of the nanosized particles in the dried droplet. The orientation and the density of the nanosized particles in the dried droplet may be affected by the principles of Deegan's mechanism which cause the fluid at the center of a drying droplet to replenish the faster evaporating liquid at the droplet's edge where the surface area to bulk material ratio is higher. This flow from the center of the droplet to the edge of the droplet causes more of the nanosized particles to be carried to the edge of the droplet as well as align the nanosized particles with the direction of the flow.

FIG. 9 is a diagram of an example of releasing droplets (900) onto a shaped surface geometry (902) according to principles described herein. In this example, the droplets (900) are released from a machine with a release nozzle (904) and a fluid reservoir (906) containing a mixture of the liquid carrier and the nanosized particles. The droplets (900) are released over a substrate (908) positioned for the droplets (900) to contact specific locations on the substrate's surface (910).

In this example, the droplets (900) are contacting the substrate's surface (910) such that each droplet (900) lands between two trenches (912). Upon impact with the substrate's surface (910), the droplets (900) spread to fill the area (914) between the trenches (912). As a result, the droplets (900) form a line with a width that spans the area between the trenches (912). This width is the desired width for the dried droplet. The trenches (912) prevent adjacent droplets (900) from spreading into each other as they dry. In examples where the nanosized particles are electrically conductive, the principles described herein allow for thin electrical pathways to be formed in close proximity to each other within micrometers or nanometers of each other without making contact. Such deposition allows the manufacture of small integrated circuits. Such devices may be used in include photonic systems, capacitive systems, inductor systems, other systems, or combinations thereof.

Figure 10:
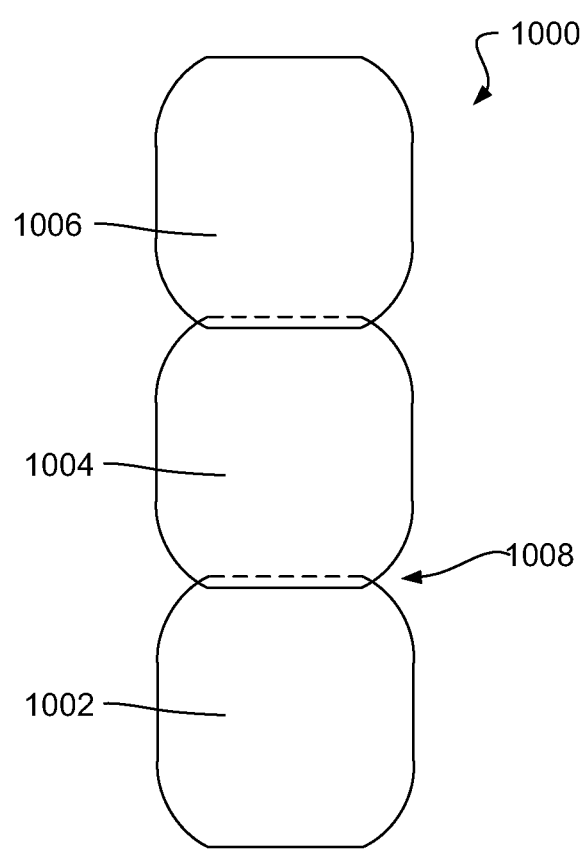
FIG. 10 is a diagram of an example of an electrically conductive pathway formed with dried droplets according to principles described herein.

FIG. 10 is a diagram of an example of an electrically conductive pathway (1000) formed with dried droplets (1002, 1004, 1006) according to principles described herein. In this example, the electrically conductive pathway (1000) is made of a series of dried droplets (1002, 1004, 1006) that have overlapping regions (1008) where the active material from adjacent dried droplets (1002, 1004, 1006) are deposited. For example, the overlapping region (1008) between dried droplet (1002) and its neighboring dried droplet (1004) results from the droplets (1002, 1004) being deposited simultaneously and spreading into each other. In other examples, the overlapping region (1008) results from droplet (1004) being deposited on the substrate after dried droplet (1002) has already dried.

The overlapping regions (1008) provide continuity of the droplets' characteristics between the dried droplets (1002, 1004, 1006). For example, if the dried droplets (1002, 1004, 1006) are electrically conductive, the overlapping regions (1008) bridge the electrically conductive characteristics of each of the droplets to form a continuous electrically conductive pathway. The electrically conductive pathway may form an electrically conductive trace on a circuit board or connect to such an integrated circuit.

While the examples above have been described with specific reference to overlapping droplets, any appropriate configurations may be made according to the principles described herein. For example, the surface geometries may be formed and arranged such that the droplets form an active electrically conductive circuit when dried. Other structures may be built in accordance with the principles described herein.

While the examples above have been described with reference to specific shaped surface geometries, any appropriate shaped surface geometry that causes the droplets' edges to form in predictable locations may be used. Such shaped surface geometries may be spaced within micrometers or nanometers of each other. The shaped surface geometries may be spaced closer together when the tolerances of the active material are intended to be tighter.

Further, while the examples above have been described with reference to certain theories of how the nanosized particles densities and orientations are brought about, the principles described herein are not bound by any of these above mentioned theories. Also, different shaped surface geometries that cause the droplets' edges to form in predictable locations may also cause the nanosized particles' densities and orientations to be arranged in different ways. For example, the highest nanosized particle density may be on a specific side of droplet or in a location other than the periphery of the dried droplet. In other examples, the flow of the drying droplet constituents caused by the shaped surface geometries causes the nanosized particle orientation to be aligned in a direction other than those described with respect to the above examples.

While the examples above have been described with reference to specific ways of forming the shaped surface geometries, any appropriate process for forming the shaped surface geometry may be used. Compatible ways to form the shaped surface geometries include photolithography, etching, micromachining, soft lithography, AFM tip transfer, transfer printing techniques, additive manufacturing processes, subtractive manufacturing processes, other processes, or combinations thereof.

The droplets may be deposited one drop at a time on the substrate surface. In other examples, the droplets are deposited simultaneous. One mechanism for simultaneously depositing the droplets is through spraying, misting, and/or atomizing the droplets onto the substrate surface.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A device comprising:
  a substrate; and
  a plurality of droplets of carrier liquid, the carrier liquid comprising an active material of nanosized particles, wherein the droplets of carrier liquid are deposited on a surface of said substrate, and wherein the droplets of carrier liquid are deposited on a number of planes above a plurality of trenches defined in said substrate and comprise an edge formed at a position determined by a transition from the number of planes to the trenches,
  wherein the droplets of carrier liquid are deposited on the surface of the substrate to form an energy pathway comprising overlapping regions of active material relative to active material of a neighboring droplet of carrier liquid,
  wherein an offset between the trenches and a pinned edge of the active material is determined at least partially by the size of the nanosized particles within the active material.

2. The device of claim 1, wherein said edge controls an orientation of said nanosized particles.

3. The device of claim 1, wherein said edge controls a density distribution of said nanosized particles.

4. The device of claim 1, wherein said surface is chemically modified to affect how said edge is formed with a coating that is one of: a hydrophilic coating on said surface, and a hydrophobic coating in said plurality of trenches, or combinations thereof.

5. The device of claim 1, wherein said nanosized particles are selected from a group consisting of electrically conductive particles, optically responsive particles, electrically responsive particles, and combinations thereof.

6. The device of claim 1, wherein said substrate comprises added hydrophilic or hydrophobic moieties.

7. The device of claim 1, wherein said number of planes are plasma treated for an increased ability to bond to the nanosized particles.

8. A method for forming the device of claim 1, the method comprising:
  forming a straight edge of said active material on said substrate by releasing a droplet of a liquid carrier containing nanosized particles dispersed therein over a surface of said substrate, said surface comprising a number of transitions from a plane to a number of trenches that control where said straight edge of said liquid carrier dries,
  wherein a first set of said number of trenches are formed perpendicular to and cross a second set of said number of trenches such that the plane is surrounded on four sides by said first and second sets of trenches in said surface of said substrate, and wherein an offset between the trenches on the substrate and a pinned edge of the active material is determined at least partially by the size of the nanosized particles within the active material.

9. The method of claim 8, wherein said active material is electrically conductive, optically responsive, electrically responsive, or combinations thereof.

10. The method of claim 8, further comprising forming multiple pillars protruding out of said surface of said substrate.

11. A system with nanosized particles deposited on shaped surface geometries, comprising:
  a substrate with an active material of nanosized particles deposited on a surface of said substrate, said active material comprising an outer edge formed at a position determined with a shaped geometry of said surface, the shaped geometry comprising a plurality of trenches defined in said substrate outside of and bounding the outer edge of the active material,
  wherein a first set of said plurality of trenches are formed perpendicular to and cross a second set of said plurality of trenches such that a plane is surrounded on four sides by the first and second sets of trenches in said surface of said substrate,
  wherein a plurality of droplets of carrier liquid are deposited on the surface of the substrate to form an energy pathway comprising overlapping regions of active material relative to active material of a neighboring drop of carrier liquid, and
  wherein an offset between the trenches and a pinned edge of the active material is determined at least partially by the size of the nanosized particles within the active material.

12. The system of claim 11, wherein said shaped geometry controls an orientation of said nanosized particles.

13. The system of claim 11, wherein said shaped geometry controls a density distribution of said nanosized particles.

14. The system of claim 11, wherein said plurality of trenches are spaced one micrometer to a hundred micrometers apart from one another on said surface.

15. The system of claim 11, wherein said plurality of trenches are spaced a hundred nanometers to one micrometer apart from one another on said surface.

16. The device of claim 1, wherein said active material fills at least one of the plurality of trenches and comprises an outer edge formed at a position determined by a transition from the plane to another of the plurality of trenches.

17. The device of claim 1, wherein the surface is hydrophilic, while the plurality of trenches are hydrophobic.

18. The system of claim 11, wherein the active material of nanosized particles are deposited on the surface of the substrate using a carrier liquid, the carrier liquid comprising the active material of nanosized particles, and wherein a plurality of droplets of carrier liquid are deposited on the surface of the substrate to form an electrically conductive pathway comprising overlapping regions of active material relative to active material of a neighboring drop of carrier liquid.

19. The device of claim 1, wherein a first set of said plurality of trenches are formed perpendicular to and cross a second set of said plurality of trenches such that the planes are surrounded on four sides by said first and second sets of trenches in said surface of said substrate.

20. The device of claim 1, wherein the planes above the trenches form a number of shaped surface geometries, and wherein said shaped surface geometries comprises multiple pillars protruding out of said surface of said substrate.

* * * * *